United States Patent [19]

Test, II

[11] 4,423,435

[45] Dec. 27, 1983

[54] ASSEMBLY OF AN ELECTRONIC DEVICE ON AN INSULATIVE SUBSTRATE

[75] Inventor: Howard R. Test, II, Lubbock, Tex.

[73] Assignee: Texas Instruments Incorporated, Dallas, Tex.

[21] Appl. No.: 200,740

[22] Filed: Oct. 27, 1980

[51] Int. Cl.³ .............................................. H01L 23/48
[52] U.S. Cl. ..................................... 357/65; 29/589; 357/80
[58] Field of Search ....................... 357/80, 72, 74, 65; 174/88 R; 29/831, 832, 841, 588, 589; 156/299, 300, 301, 629, 630

[56] References Cited

U.S. PATENT DOCUMENTS

| | | | |
|---|---|---|---|
| 3,808,679 | 5/1974 | Dalmasso | 357/72 |
| 4,074,419 | 2/1978 | Hanni et al. | 357/80 |
| 4,113,981 | 9/1978 | Fujita et al. | 174/88 R |
| 4,250,520 | 2/1981 | Denlinger | 357/80 |

Primary Examiner—James W. Davie

Attorney, Agent, or Firm—Robert D. Marshall, Jr.; Leo N. Heiting; Melvin Sharp

[57] ABSTRACT

An electronic device, such as an integrated circuit formed on a single semiconductor chip, is mounted on a relatively flat insulative substrate, such as a chip carrier or printed circuit board, and electrically connected to electrical conductors on the substrate by means of a bonding material disposed between the device and substrate. The device is placed on the substrate with its electrically active surface in facing relationship with the substrate and with its electrical contact pads in registration with selected ones of the substrate conductors. The bonding material is substantially electrically conductive only along one axis which is orthogonal to the major planes of the device and substrate to provide an electrically conductive path between the contact pads and electrical conductors. The bonding material is allowed to accumulate along the perimeter of the electronic device to form a protective seal between the electronic device and the substrate.

10 Claims, 5 Drawing Figures

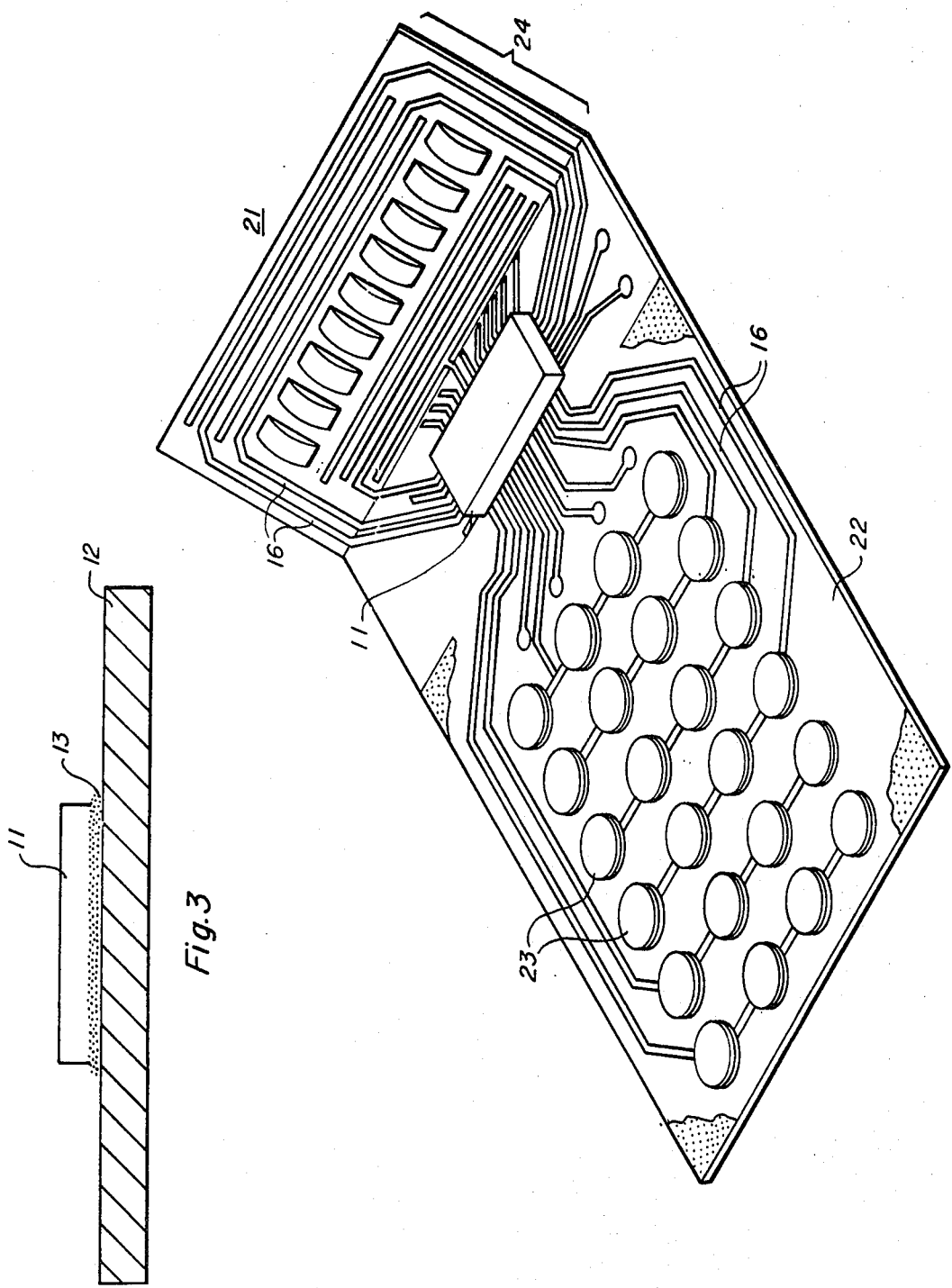

ASSEMBLY OF AN ELECTRONIC DEVICE ON AN INSULATIVE SUBSTRATE

BACKGROUND OF THE INVENTION

This invention relates to electronic devices and in particular to the assembly of an electronic device on an insulative substrate.

Various processes are known in the art for assembling and packaging an electronic device, such as an integrated circuit formed on a single semiconductor chip. Such processes typically include the steps of mounting the device on an insulative substrate having a plurality of electrical conductors in a predetermined pattern thereon; electrically coupling the contact pads of the device to the substrate conductors; molding a protective plastic casing around the device; and trimming and forming electrical leads amanating from the plastic casing to form the desired package.

A common device package is the so-called "dual in line" package (DIP) wherein the electronic device is encapsulated and sealed within a molded plastic casing. The process of manufacturing DIP's is comprised of the steps of affixing the electronic device to a central mounting pad in a metal lead frame with the electrically active area of the device in an "up" or exposed position, i.e. away from the mounting pad; bonding the contact pads located on the perimeter of the device to the leads of the lead frame by soldering fine gold wires to the contact pads and leads to effect electrical interconnection between the device and lead frame; encapsulating the device and the lead frame in a plastic casing by an injection or transfer molding process; and trimming and forming the electrical leads of the lead frame to the desired length and configuration. The electrical leads emanating from the plastic casing can be bent or otherwise shaped to provide the necessary "plug in" connection to a printed circuit board or the like. Such a process is described in U.S. Pat. No. 3,882,807, assigned to the assignee of the present invention. While dual in line packaging is a popular assembly technique, it also has several disadvantages. First, the process is somewhat complicated in that it involves several different steps and requires relatively expensive bonding materials such as, for example, gold wires. Second, the contact pads of the device are located on or near the perimeter thereof and elevated above the electronic circuitry for proper electrical interconnection, thereby tending to increase the area of the semiconductor chip on which the electronic circuitry is formed.

Another technique, as described in U.S. Pat. No. 3,669,734, involves the so-called "flip chip" approach, whereby the electronic device is placed with its active surface "down" on an insulative substrate, i.e. in facing relationship with the substrate. A layer of conductive material such as copper or nickel is deposited on the contact pads of the device through openings in a passivation layer which protects the electronic circuitry. Solder material is introduced into the openings and the entire package is heated, thereby forming solder "bumps" of copper or nickel above the contact pads which are solder-bonded to selected conductors of the substrate to electrically couple the device to the substrate. Alternatively, the contact pads can be bonded to the substrate conductors by ultrasonic bonding techniques, as described in U.S. Pat. No. 3,440,027. The device is then encapsulated in a molded plastic casing and the electrical leads emanating therefrom trimmed and formed as previously described. Although the "flip chip" technique provides added protection for the electronic circuitry because the active surface is face down on the substrate, separate mounting and electrical bonding steps are still required. The electrical bonding step, in particular, is expensive because of the need for gold bonding wires, solder materials and the like.

Recently, conductive adhesives and the like have been used to replace solders and brazing alloys to bond electrical components together. Conductive adhesives typically form stronger bonds than most solders and are often less expensive than solders or brazing alloys. By adjusting the concentration of conductive metal particles in the adhesive, the conductivity thereof can be controlled for the desired application. The characteristics and applications of conductive adhesive materials are discussed in detail in a paper entitled "Conductive Adhesives, Inks and Coatings", by Justin C. Bolger et al, which was presented at the "Adhesives for Industry" Conference at El Segundo, California on June 24, 1980.

SUMMARY OF THE INVENTION

It is therefore an object of the present invention to provide an improved method for assembling an electronic device on an insulative substrate.

It is another object of the invention to provide an improved technique for packaging an integrated circuit device.

It is yet another object of the present invention to simplify the assembly of an electronic semiconductor device on an insulative substrate.

It is still another object of the invention to reduce the expense of assembling an integrated circuit on an insulative substrate.

It is a further object of the invention to reduce the size of a semiconductor chip on which an integrated circuit or other electronic device is mounted.

It is still a further object of the invention to provide an improved method of electrically bonding an electronic device to an insulative substrate.

It is yet a further object of the invention to provide an electronic circuit package which does not require a protective cover or encapsulation.

These and other objects are accomplished in accordance with the present invention wherein an electronic device is mounted on an insulative substrate and electrically coupled thereto by means of a bonding material disposed between the device and substrate. The bonding material is substantially electrically conductive only along an axis orthogonal to major surfaces of the device and substrate so that electrical contact is effected between electrical connector means of the device and selected ones of a plurality of electrical conductors on the substrate without cross-talk or other interference between adjacent conductors.

In a preferred embodiment the electronic device is a semiconductor component, such as an integrated circuit fabricated on a single semiconductor chip, with a plurality of contact pads formed on an electrically active major surface thereof and accessible via openings in a passivation layer, which provides a protective covering for the electronic circuitry on the active major surface. The bonding material is disposed on the substrate at a predetermined thickness and the device is placed on the bonding material with its active area "down", i.e. the so-called "flip chip" technique, so that the contact pads are in facing relationship with the electrical conductors on the substrate and in registration with selected ones of the conductors. The bonding material is then heated to a predetermined temperature so that it bonds the electronic device and the substrate securely together and migrates into openings in the passivation layer to electrically couple the device to the substrate. The bonding material is allowed to accumulate along the perimeter of the device to form a protective seal, thereby eliminating the need for a protective cover or encapsulation.

The advantages of the present invention include: (1) simplifying the assembly process by combining the conventional mounting and electrical bonding steps into a single mounting/bonding step and eliminating the need for molding, trimming and forming steps; (2) reducing the area of the semiconductor chip because the contact pads can be positioned anywhere on the chip and not strictly on the perimeter thereof; and (3) effecting cost savings by eliminating the need for expensive bonding wires, solder bumps and the like.

BRIEF DESCRIPTION OF THE DRAWINGS

Still further objects and advantages of the invention will be apparent from the Detailed Description and Claims when read in conjunction with the accompanying drawings wherein:

FIG. 3 is an elevational view of the electronic device mounted on the insulative substrate showing a layer of bonding material disposed therebetween; and FIG. 4 is a perspective view of an electronic calculator system with the electronic device mounted on a printed circuit board and being electrically coupled to a keyboard and display of the calculator system.

DETAILED DESCRIPTION OF THE INVENTION

Figure 1A:
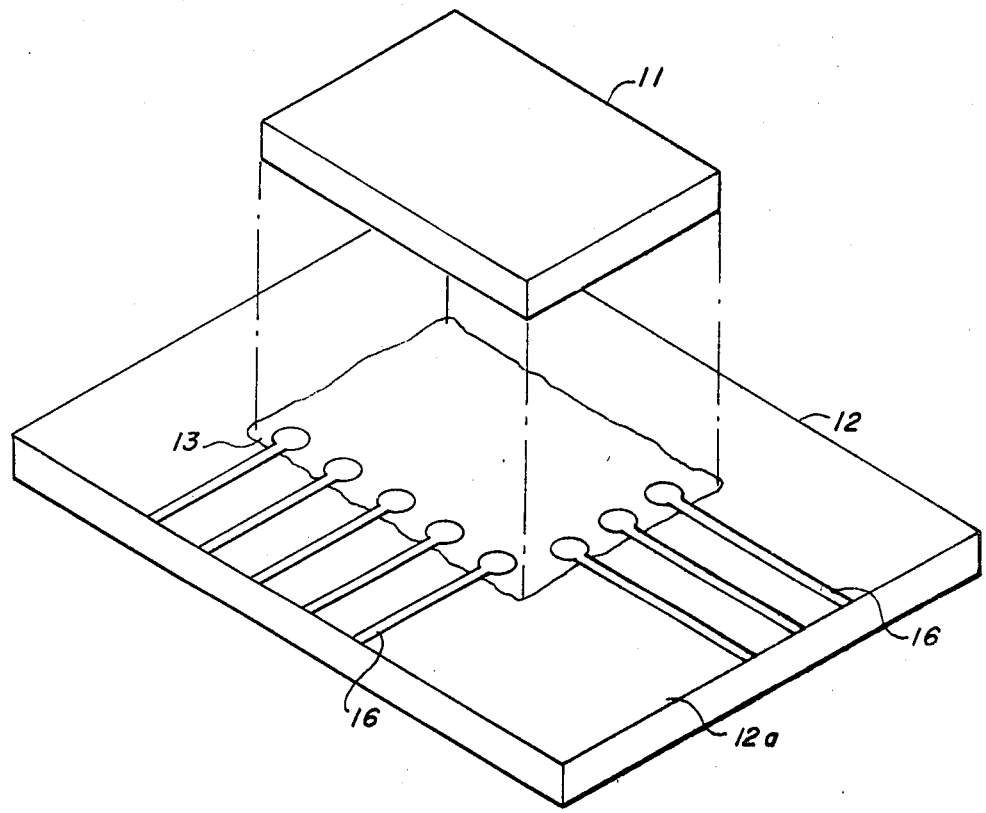
FIGS. 1a and 1b are perspective views of an electronic device and insulative substrate showing the alignment of the electronic device with respect to the substrate for assembling the device on the substrate.
Figure 1B:
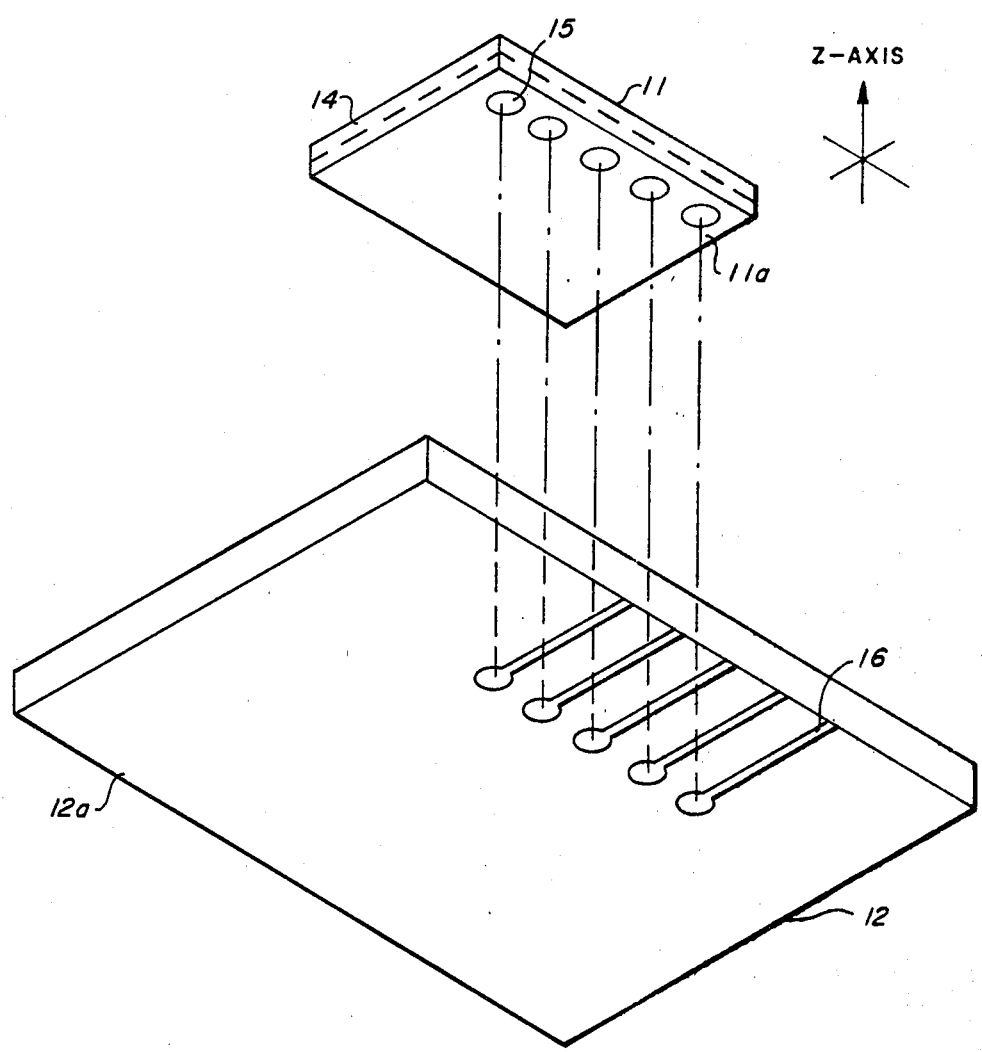

Referring to FIGS. 1a and 1b, an electronic device 11 such as, for example, an integrated circuit formed on a single semiconductor chip, is mounted on a relatively flat insulative substrate 12 by means of a bonding material 13. A passivation layer 14 is formed on an electrically active major surface 11a, i.e. the surface on which the electronic circuitry is formed, of device 11 to protect the electronic circuitry thereof. Contact pads (not shown) are provided on major surface 11a for coupling device 11 to an external electronic component or circuit. The contact pads, which are preferably on the order of 3-5 mils wide, are accessible via openings 15 in passivation layer 14.

Substrate 12 includes a plurality of electrical conductors 16 formed in a predetermined metalization pattern by thick film, thin film or lamination type processes on a major surface 12a thereof. The geometry of conductors 16 corresponds to that of the contact pads on major surface 11a so that the contact pads are in registration with selected ones of conductors 16 when device 11 is mounted on substrate 12 to effect electrical contact between device 11 and substrate 12. Conductors 16 are each preferably on the order 3-5 mils wide with approximately 3-5 mils spacing between adjacent conductors.

Bonding material 13 is an adhesive type material which exhibits anisotropic electrical conductivity properties, such as a solvent based epoxy of the UNISET C928-06 type, developed by Amicon Corporation of Lexington, Mass. This material is comprised of a mixture of fine powdered silver flakes, a linear polyester resin derived from ethylene glycol and terephthalic acid and a solvent for the polyester resin in proportions of 3 parts silver to 1 part resin to 2 parts solvent by weight. The electrical conductivity of the mixture is dependent upon the volume of silver contained therein. Since the density of silver is approximately nine times greater than the densities of the resin and the solvent, volume proportions of silver, resin and solvent are approximately 1 part silver to 3 parts resin to 6 parts solvent. With these relative proportions, the spacing between individual silver flakes is sufficient to prevent the mixture from being electrically conductive. If, however, the mixture is deposited as a thin film on a flat substrate and the solvent is allowed to evaporate, the resin will contact predominantly along a Z axis, i.e. normal to the plane of the film, thereby causing the silver flakes to move much closer together and the mixture to become substantially electrically conductive along the Z-axis. Because shrinkage of the resin is predominantly along the Z-axis, the mixture remains non-conductive along X- and Y-axes, i.e. in the plane of the film, thereby yielding anisotropic electrical conductivity properties.

Device 11 is assembled on substrate 12 as follows. A relatively thin (1 mil) layer of bonding material 13 is deposited on major surface 12a and over an area comparable to the area covered by the contact pads (on the order of 100 mils × 100 mils). The solvent in bonding material 13 is allowed to evaporate to provide the anisotropic electrical conductivity properties described above. Since the thickness of bonding material 13 is much less than the lateral dimensions thereof, bonding material 13 will be substantially electrically conductive only along a Z-axis, i.e. along an axis perpendicular to major surfaces 11a and 12a in FIG. 1b. Device 11 is placed on bonding material 13 with active major surface 11a in facing relationship with major surface 12a of substrate 12 and the contact pads in registration with selected ones of conductors 16. Placing device 11 with its active surface in a "down" position is commonly referred to as the "flip chip" technique and has the advantage of protecting the electronic circuitry and components on active major surface 11a of device 11. Device 11 must be precisely positioned (typically +0.5−1.0 mil tolerance) on substrate 12 to ensure that the contact pads are in proper alignment with the corresponding conductors 16 to effect proper electrical interconnections.

Bonding material 13 is cured by heating and then allowed to cool so that device 11 and substrate 12 are bonded securely together. Further, bonding material 13, in response to the application of heat, flows through openings 15 and makes contact with the contact pads so that electrical contact is effected between the contact pads and respective conductors 16 along the Z-axis. Bonding material 13 is non-conductive along the X- and Y-axes, i.e. in a plane parallel to major surfaces 11a and 12a. As such, unwanted cross-talk and other electromagnetic interference between adjacent conductors 16 are minimized. Because bonding material 13 performs the dual function of mechanically bonding device 11 to substrate 12 and electrically coupling device 11 to substrate 12, there is no need for a separate electrical bonding step and hence no need for bonding wires, soldering and the like.

Figure 2:
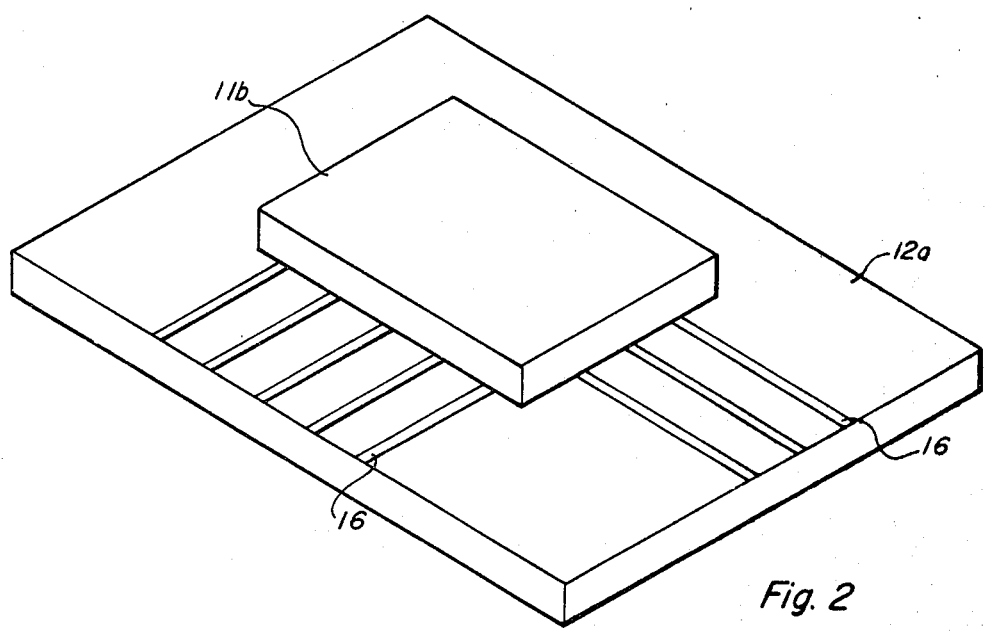
FIG. 2 is a perspective view of the electronic device mounted on the substrate and electrically coupled thereto.

FIG. 2 depicts the assembled electronic package with device 11 mounted on substrate 12 and electrically coupled thereto. Major surface 11b, which is electrically inactive, is in an "up" or exposed position, thereby affording protection for the electronic circuitry on opposite major surface 11a. Further, as shown in FIG. 3, bonding material 13 tends to accumulate along the perimeter of device 11 during the assembly process to provide additional protection for the electronic circuitry. The protection afforded the electronic circuitry by using the "flip chip" approach and allowing bonding material 13 to form a protective seal around device 11 has the advantage of eliminating the need for additional molding, trimming and forming steps associated with conventional assembly techniques, whereby the device is encapsulated in plastic to form a sealed package and electrical leads emanating from the package are trimmed and formed to provide the desired lead configuration.

Those skilled in the art will appreciate that the assembly technique of the present invention can be used to mount an electronic device, such as an integrated circuit chip or the like, on a variety of substrates, such as, for example, a ceramic chip carrier, a film-type substrate, or a conventional printed circuit board to form an integral package. Further, device 11 and substrate 12 can be encapsulated in plastic and the electrical leads trimmed and formed to provide a standard dual in line package (DIP). Alternatively, device 11 can be mounted directly on a substrate in an electronic system, such as, for example, a printed circuit board in an electronic calculator, a glass or film substrate in a liquid crystal display or a thermal printhead.

FIG. 4 depicts a typical electronic calculator system 21 having a keyboard substrate 22 with a plurality of key switches 23 positioned thereon and a display system 24. Electronic device 11, which is preferably an integrated circuit, is mounted directly on keyboard substrate 22 using the above-described assembly techniques and is electrically coupled to key switches 23 and display system 24 by means of conductors 25 on substrate 22. Alternatively, device 11 can be mounted on a separate substrate in a plastic package with a plurality of leads emanating therefrom. The leads are then coupled to selected ones of electrical conductors 25 on keyboard substrate 22, preferably by soldering, to incorporate the electronic circuit package into calculator system 21.

Advantages of the present invention include simplifying the assembly process by combining the conventional mounting and electrical bonding steps into a single mounting/bonding step and eliminating the need for molding, trimming and forming steps associated with conventional packaging techniques; reducing the area of the electronic device because electrical connections can be made in the interior of the chip and do not have to be bonded out to the edge thereof; and reducing the cost of assembly by eliminating the need for expensive bonding wires, plastic encapsulation and solder "bumps". Thus, the present invention makes possible the formation of higher density electronic devices within a smaller chip area and is particularly well-suited for electronic circuit devices comprised of low power MOS components.

Various embodiments of the invention have now been described in detail. Since it is obvious that many additional changes and modifications can be made in the above-described details without departing from the nature and spirit of the invention, the invention is not to be limited to these details except as set forth in the appended claims.

What is claimed is:

1. An electronic device package comprising:
   (a) an insulative substrate having a plurality of electrical conductors on a major surface thereof;
   (b) an electronic device having electrical connector means on a major surface thereof for electrically connecting said electronic device to an external electrical component, said electronic device being mounted on said substrate so that said major surface of said device is in facing relationship with said major surface of said substrate and said electrical connector means is in registration with selected ones of said electrical conductors; and
   (c) a bonding material interposed between said major surfaces for mechanically bonding said electronic device to said substrate, said bonding material further disposed along the perimeter of said electronic device to form a protective seal between said electronic device and said insulative substrate, and said bonding material being substantially electrically conductive only along an axis which is orthogonal to said major surfaces to form an electrically conductive path between said electrical connector means and said electrical conductors.

2. The package according to claim 1 wherein:
said electronic device comprises an integrated circuit having electronic circuitry formed on said major surface, having a plurality of contact pads forming said electrical connector means and having a passivation layer formed on said major surface for protecting said electronic circuitry, said passivation layer having openings therein in registration with said contact pads; and
said bonding material is further disposed in said openings in said passivication layer contacting said contact pads for forming an electrically conductive path between said contact pads and said electrical conductors on said substrate.

3. An electronic system comprising:
   (a) an insulative substrate having a plurality of electrical conductors on a major surface thereof;
   (b) an electronic device having electrical connector means on a major surface thereof, said electronic device being mounted on said substrate so that said major surface of said device is in facing relationship with said major surface of said substrate and said electrical connector means is in registration with selected ones of said electrical conductors;
   (c) a bonding material interposed between said major surfaces for mechanically bonding said electronic device to said substrate, said bonding material further disposed along the perimeter of said electronic device to form a protective seal between said electronic device and said insulative substrate, and said bonding material being substantially electrically conductive along an axis which is orthogonal to said major surfaces to form an electrically conductive path between said electrical connector means and said electrical conductors; and
   (d) at least one electrical component mounted on said substrate and electrically coupled to said electronic device by means of selected ones of said electrical conductors on said substrate.

4. The system according to claim 3 further including a plurality of electrical components mounted on said substrate and electrically coupled to said electronic device by means of said selected ones of said electrical conductors.

5. The system according to claim 3 wherein said electrical component is an electronic keyboard having a plurality of manually-operable key switches.

6. The system according to claim 3 wherein said electrical component has electrical connector means on a major surface thereof and said electrical component is mechanically bonded to said substrate by means of said bonding material interposed between said major surface of said electrical component and said major surface of said substrate, said bonding material also forming an electrically conductive path between said electrical connector means of said electrical component and said electrical conductors of said substrate.

7. The system according to claim 6 further including a plurality of said electrical components, each of which is mechanically bonded to said substrate and electrically coupled to selected ones of said electrical conductors by means of said bonding material, each of said electrical components being electrically coupled to said electronic device by means of said electrical conductors on said substrate.

8. The package according to claim 3 wherein:
said electronic device comprises an integrated circuit having electronic circuitry formed on said major surface, having a plurality of contact pads forming said electrical connector means and having a passivation layer formed on said major surface for protecting said electronic circuitry, said passivation layer having openings therein in registration with said contact pads; and
said bonding material is further disposed in said openings in said passivication layer contacting said contact pads for forming an electrically conductive path between said contact pads and said electrical conductors on said substrate.

9. A method of assembling an electronic device on an insulative substrate comprising the steps of:

(a) providing an electronic device having electrical connector means on a major surface thereof for electrically connecting the device to an external electrical component and an insulative substrate having a plurality of electrical conductors on a major surface thereof;

(b) applying a bonding material to a predetermined thickness at a predetermined location on one of said major surfaces said bonding material being substantially electrically conductive only along one axis thereof;

(c) placing said electronic device on said substrate so that said major surface of said electronic device is in a facing relationship with said surface of said substrate and said electrical connector means is in registration with selected ones of said electrical conductors with said bonding material interposed therebetween;

(d) allowing said bonding material to accumulate along the perimeter of said electronic device to form a protective seal between the device and substrate; and (e) heating said bonding material to a predetermined temperature for a predetermined period of time so that said bonding material mechanically bonds said device and substrate together, forms an electrically conductive path between said electrical connector means and said selected ones of said electrical conductors and forms a protective seal between said electronic device and said substrate.

10. The method according to claim 9 wherein said electronic device includes a passivation layer on said major surface, said passivation layer having openings formed therein to provide access to said electrical connector means, said bonding material penetrating said openings in response to the application of heat to effect electrical contact between the electrical connector means and said selected ones of said electrical conductors.

* * * * *